(12) United States Patent
Van Der Wiel

(10) Patent No.: US 11,655,142 B2
(45) Date of Patent: May 23, 2023

(54) METHOD OF MANUFACTURING A SENSOR DEVICE AND MOULDING SUPPORT STRUCTURE

(71) Applicant: Melexis Technologies NV, Tessenderlo (BE)

(72) Inventor: Appolonius Jacobus Van Der Wiel, Duisburg (BE)

(73) Assignee: MELEXIS TECHNOLOGIES NV, Tessenderlo (BE)

( * ) Notice: Subject to any disclaimer, the term of this patent is extended or adjusted under 35 U.S.C. 154(b) by 577 days.

(21) Appl. No.: 16/744,593

(22) Filed: Jan. 16, 2020

(65) Prior Publication Data

US 2020/0231432 A1    Jul. 23, 2020

(30) Foreign Application Priority Data

Jan. 21, 2019 (EP) ..................... 19152728

(51) Int. Cl.
*B81C 1/00* (2006.01)
*B81C 99/00* (2010.01)
(Continued)

(52) U.S. Cl.
CPC ........ *B81B 7/0051* (2013.01); *B81C 1/00325* (2013.01); *G01L 9/0072* (2013.01);
(Continued)

(58) Field of Classification Search
CPC ......... H01L 21/67144; H01L 21/67236; B81C 99/009
See application file for complete search history.

(56) References Cited

U.S. PATENT DOCUMENTS

2009/0072333 A1    3/2009  Haag et al.
2009/0102033 A1    4/2009  Raben
(Continued)

FOREIGN PATENT DOCUMENTS

EP          2096423 A2    9/2009
JP       2009058230 A     3/2009
(Continued)

OTHER PUBLICATIONS

Extended European Search Report; dated Jul. 16, 2019; Application No. EP19152728; Munich, Germany.

*Primary Examiner* — Moazzam Hossain
(74) *Attorney, Agent, or Firm* — Harness, Dickey & Pierce, P.L.C.

(57) ABSTRACT

A method of manufacturing a sensor device comprising: configuring a moulding support structure and a packaging mould so as to provide predetermined pathways to accommodate a moulding compound, the moulding support structure defining a first notional volume adjacent a second notional volume. An elongate sensor element and the moulding support structure are configured so that the moulding support structure fixedly carries the elongate sensor element and the elongate sensor element resides substantially in the first notional volume and extends towards the second notional volume, the elongate sensor element having an electrical contact electrically coupled to another electrical contact disposed within the second notional volume. The moulding support structure carrying (102) the elongate sensor element is disposed within the packaging mould (106). The moulding compound is then introduced (110) into the packaging mould during a predetermined period of time (112) so that the moulding compound fills the predetermined pathways, thereby filling the second notional volume and surrounding the elongate sensor element within the second (Continued)

notional volume without contacting the elongate sensor element.

15 Claims, 6 Drawing Sheets

(51) Int. Cl.
*B81B 7/00* (2006.01)
*G01L 9/00* (2006.01)

(52) U.S. Cl.
CPC ............... *B81B 2201/0264* (2013.01); *B81B 2203/0127* (2013.01); *B81B 2207/098* (2013.01); *B81C 1/0046* (2013.01); *B81C 2203/0154* (2013.01)

(56) References Cited

U.S. PATENT DOCUMENTS

| | | | | |
|---|---|---|---|---|
| 2013/0011970 A1* | 1/2013 | Honda | ............... | H01L 23/3107 438/118 |
| 2016/0169758 A1* | 6/2016 | Hooper | ............... | G01L 9/0073 73/717 |
| 2020/0189908 A1* | 6/2020 | Dangelmaier | ...... | B81C 1/00309 |

FOREIGN PATENT DOCUMENTS

| | | | |
|---|---|---|---|
| JP | 2011119500 A | * | 6/2011 |
| JP | 2014067878 A | | 4/2014 |
| JP | 2014150129 A | | 8/2014 |

\* cited by examiner

METHOD OF MANUFACTURING A SENSOR DEVICE AND MOULDING SUPPORT STRUCTURE

PRIORITY STATEMENT

The present application hereby claims priority under 35 U.S.C. § 119 to European patent application number EP 19152728.2 filed Jan. 21, 2019, the entire contents of which are hereby incorporated herein by reference.

FIELD

The present invention relates to a method of manufacturing a sensor device, the method being of the type that, for example surrounds an elongate sensor device within a package. The present invention also relates to a moulding support structure of the type that, for example, receives an electrical element for encapsulation therein.

BACKGROUND

In the field of semiconductor sensor devices, it is known to dispose a pressure sensor element within a cavity of a pre-moulded lead frame package or other package. A known so-called "overmoulding" technique can be employed, whereby an integrated circuit is glued to a lead frame and electrically connected by bond wires to connecting pads located on an internal surface of the package. The integrated circuit is then secured within the package by employing an overmoulding technique that encapsulates the integrated circuit and the bond wires, but leaves a cavity with exposed bond pads for attachment to a pressure sensor element. The pressure sensor element is then glued in the cavity and wire bonded to an application specific integrated circuit and/or the lead frame, the bond wires being protected by the application of a gel. However, such a technique for providing a housing requires wire bonding and die attach process steps be performed twice: before and after the moulding. Disadvantageously, the bond wires connecting the sensor to the pads in the cavity have to be protected with a gel that, when the sensor device is in use, applies a disturbing force on a sensing membrane of the pressure sensor element, thereby causing the generation of error signals. Although the sensor cannot simply be mounted and wire bonded with the integrated circuit, a modified approach of providing a cavity in the mould compound to keep the area of the membrane free of mould compound also has disadvantages. In this regard, the high stiffness and high thermal expansion of the mould compound results in the packaging applying a great deal of stress to the sides of the sensor element and integrated circuit when the part cools down after curing the mould compound. This typically causes a deterioration in the output signal of the pressure sensor device, and so renders such a packaging technique unsuitable. Furthermore, it is known for the stress to change over time, thereby causing an output signal generated by the sensor element to drift by more than 2% or even 10% of the full scale output of the sensor element when the side walls of the sensor element are in contact with the mould compound.

In some implementations, chemical protection is provided by a gel that envelops the pressure sensor element, the bond wires and the connecting pads. However, the resistance of the packaged sensor device to harsh media is defined by the physical and chemical properties of the gel. Also, the gel adds an offset to the pressure sensed by the pressure sensor element and creates a g-force when the pressure sensor is exposed to acceleration, which can be an important influence on measurements made in automotive applications. Furthermore, all metals in the cavity, for example bond pads of the pressure sensor element, fingers of the leadframe, and bond-wires, have to be noble. The processing, and the resulting packaged device, is therefore complicated and relatively expensive.

U.S. patent publication no. 2009/0102033 describes a package for an integrated circuit, the package comprising a housing providing a pair of parallel surfaces, and a lead frame for carrying the integrated circuit. The package comprises a through-hole in two surfaces and employs the overmoulding technique mentioned above.

SUMMARY

According to a first aspect of the present invention, there is provided a method of manufacturing a sensor device, the method comprising: configuring a moulding support structure and a packaging mould so as to provide predetermined pathways to accommodate a moulding compound, the moulding support structure defining a first notional volume adjacent a second notional volume; configuring an elongate sensor element and the moulding support structure so that the moulding support structure fixedly carries the elongate sensor element and the elongate sensor element resides substantially in the first notional volume and extends towards the second notional volume, the elongate sensor element having an electrical contact electrically coupled to another electrical contact disposed within the second notional volume; disposing the moulding support structure carrying the elongate sensor element within the packaging mould; and introducing the moulding compound into the packaging mould during a predetermined period of time so that the moulding compound fills the predetermined pathways, thereby filling the second notional volume and surrounding the elongate sensor element within the first notional volume without substantially contacting the elongate sensor element.

The sensor device may be moulded using a film-assisted moulding technique.

The method may further comprise: configuring the packaging mould to prevent a portion of the first notional volume from being filled with the moulding compound.

The method may further comprise: configuring the moulding support structure and the elongate sensor element to cooperate to define a restrictive channel at a side of the elongate sensor element extending from an interface between the first notional volume and the second notional volume.

The method may further comprise: configuring the moulding support structure and the elongate sensor element to cooperate to define respective restrictive channels at lateral sides of the elongate sensor element extending from an interface between the first notional volume and the second notional volume.

The method may further comprise: configuring the moulding support structure to provide a recess for capturing ingress of excess moulding compound into the first notional volume.

The method may further comprise: configuring the moulding support structure to provide respective recesses either lateral side of the elongate sensor element for capturing ingress of excess moulding compound into the first notional volume.

The method may further comprise: configuring the moulding support structure to provide a spaced peripheral wall extending around a portion of the elongate sensor element to be exposed following packaging; configuring the spaced peripheral wall to surround substantially the lateral sides of the elongate sensor element in peripheral spaced relation, thereby defining a peripheral space around the lateral sides of the portion of the elongate sensor element residing in the first notional volume; and wherein the spaced peripheral side wall may define the restrictive channel.

The packaging mould may comprise a mould chase; the mould chase may be configured to overlie at least in part the spaced peripheral wall, thereby limiting ingress of moulding compound into the peripheral space.

The packaging mould may be configured to urge a compressible film against the elongate sensor element and the moulding support structure during moulding.

The method may further comprise: stamping out the spaced peripheral wall of the moulding support structure following completion of moulding of the sensor device.

The configuration of the elongate sensor element and the moulding support structure, so that the moulding support structure fixedly carries the elongate sensor element, may comprise: providing the moulding support structure having a surface configured to receive the elongate sensor element; and adhering the elongate sensor element to the surface of the moulding support structure configured to receive the elongate sensor element.

The method may further comprise: configuring the moulding support structure to provide another surface to receive one or more electrical components and/or devices.

The one or more electrical components may be a driver circuit, for example a sensor element driver circuit or one or more passive elements, for example one or more capacitors. A die may comprise the one or more electrical components and/or devices.

The method may further comprise: affixing the one or more electrical components and/or devices to the another surface.

Affixing the one or more electrical components and/or devices to the another surface may comprise: affixing an integrated circuit to the another surface.

The method may further comprise: connecting bond wires to the elongate sensor element and the one or more electrical components and/or devices prior to disposing the lead frame in the packaging mould.

The moulding support structure may comprise the another electrical contact or the one or more electrical components and/or devices may comprise the another electrical contact.

The method may further comprise: disposing the moulding support structure carrying the elongate sensor element within the packaging mould with the elongate sensor element bridging the first and second notional volumes, thereby extending into the second notional volume so as to reside partially in the second notional volume.

After moulding, the elongate sensor element may have an exposed end surface distal from an end of the elongate sensor element encapsulated in the moulding compound, and the sensor device may have a peripheral moulded outer wall formed from the moulding compound having an inner surface opposite the exposed end surface; the method may further comprise: depositing a soft encapsulant over an exposed portion of the elongate sensor element, the soft encapsulant being deposited so as to bridge a spacing between the exposed end surface and the inner surface of a portion of the peripheral wall opposite the exposed end surface.

According to a second aspect of the invention, there is provided a lead frame package comprising: a moulded peripheral frame structure defining an internal volume; a lead frame configured to pass between an interior of the peripheral frame structure and an exterior of the peripheral frame structure; wherein the lead frame comprises a removable cavity reservation portion occupying a substantially U-shaped peripheral volume within the internal volume.

It is thus possible to provide a support structure and a method of manufacturing a sensor device that support the use of fewer moulding steps than known sensor packaging techniques. In this respect, a second and any subsequent moulding steps are not required, thereby simplifying the manufacture of the sensor device and the cost of production thereof. The support structure and the method also support the incorporation of both a sensor element and a separate die, for example an integrated circuit die, within the same package together prior to a single application of the moulding compound to secure both the sensor element and the die. The support structure and the method further permit the sensor and/or the separate die to be wire bonded and the wire bonding to be encapsulated within a moulding compound. The method permits the application of a soft encapsulant over the sensor element to become optional unless a relative sensor device is being made.

BRIEF DESCRIPTION OF THE DRAWINGS

At least one embodiment of the invention will now be described, by way of example only, with reference to the accompanying drawings, in which.

DETAILED DESCRIPTION OF THE EXAMPLE EMBODIMENTS

Figure 1:
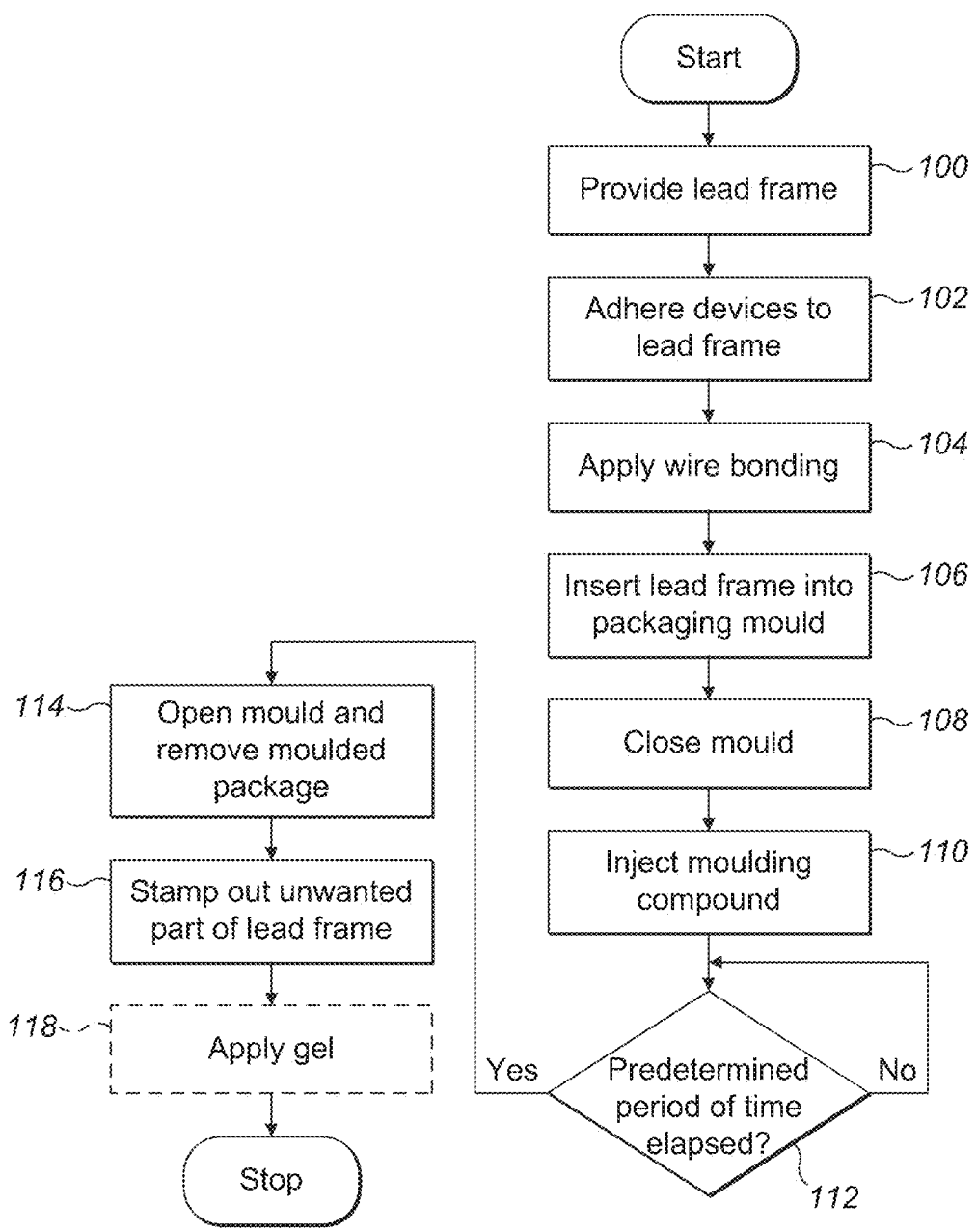
FIG. 1 is a flow diagram of a method of manufacturing a sensor device constituting an embodiment of the invention.
Figure 2:
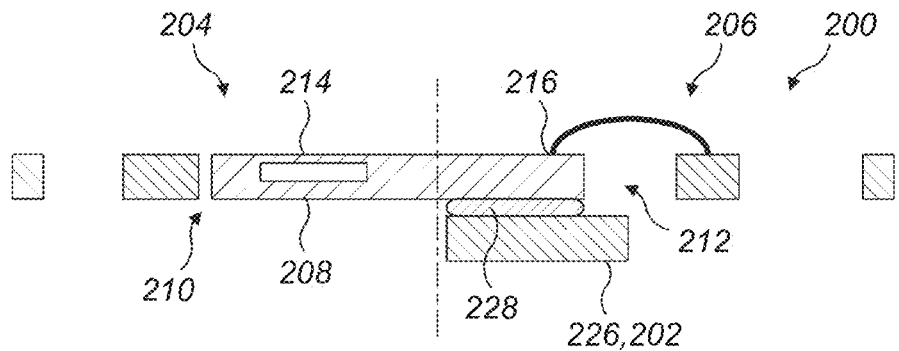
FIG. 2 is a schematic cross section of a lead frame carrying an elongate sensor element constituting an embodiment of the invention.
Figure 3:
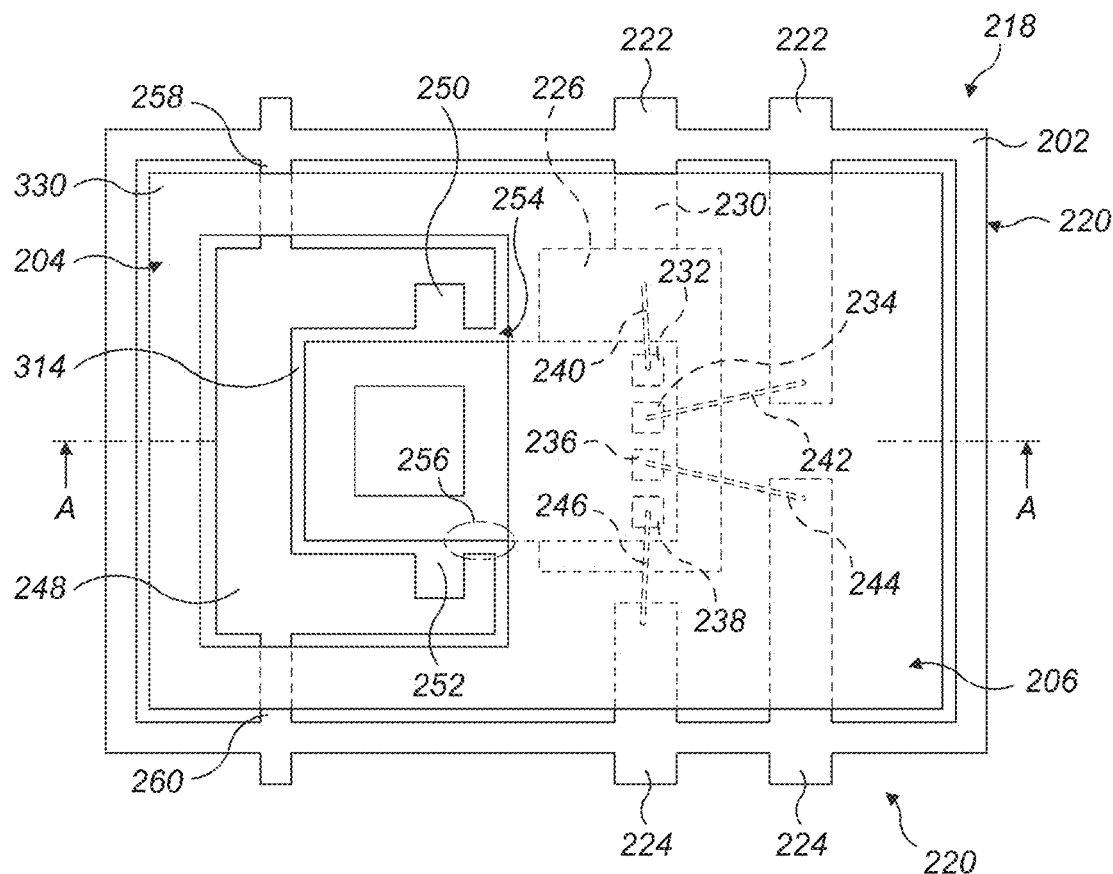
FIG. 3 is a schematic plan view of the lead frame carrying the elongate sensor element of FIG. 1.

Throughout the following description, identical reference numerals will be used to identify like parts.

Referring to FIGS. 1 to 4, a method of manufacturing a sensor device, for example a pressure sensor device 200 (FIG. 2), comprises providing (Step 100) a moulding support structure, for example a lead frame 202. It should, however, be appreciated that any suitable package can be employed, for example a frame package or a lead frame-based package. Other packages that can be employed include, for example: ceramic packages or laminate packages or indeed any package or structure that can support at least two notional volumes therein, including a cavity. The lead frame 202 is configured to delineate a first (notional) volume 204 to be free of encapsulant and a second (notional) volume 206 to be encapsulated.

A sensor element, for example a generally elongate sensor element, such as a pressure sensor element 208, is disposed on the lead frame 202. The pressure sensor element 208 and the lead frame 202 have similar thicknesses. For example, the lead frame 202 can have a thickness of between about 50 µm and 400 µm, for example about 50 µm, about 100 µm, about 200 µm or about 400 µm, and the pressure sensor element can have a similar thickness to the lead frame 202 to within +/−10 µm or +/−25 µm. The pressure sensor element 208 comprises a first end 210 and a second end 212, the pressure sensor element 208 comprising a membrane 214 at the first end 210 thereof to provide a sensing region of the pressure sensor element 208, and one or more first electrical contacts 216, for example bond pads, at the second end 212 thereof. The membrane 214 resides within the first volume 204. The pressure sensor element 208 bridges the volume of the first and second volumes 204, 206. The pressure sensor element 208 substantially resides within the first volume 204, i.e. the majority of the pressure sensor element 208 resides within the first volume 204, but extends and protrudes into the second volume 206. In this respect, the second end 212 of the pressure sensor element 208 extends sufficiently into the second volume 206 such that the first electrical contacts 216 of the pressure sensor element 208 reside within the second volume 206. In this example, the second end 212 of the pressure sensor element 208 extends sufficiently into the second volume 206 so at least part of the first electrical contacts 216 are connectable within the second volume 206.

The lead frame 202 is, in this example, pre-moulded, and generally elongate in shape, such as rectangular in shape. The lead frame 202 comprises a first lateral side 218 and a second lateral side 220 that respectively carry a first plurality of pins 222 of a lead frame and a second plurality of pins 224 of the lead frame. The shape of the first volume 204 is, in this example, generally hyperrectangular. Similarly, the shape of the second volume 206 is, in this example, generally hyperrectangular.

The second end 212 of the pressure sensor element 208 comprising the one or more first electrical contacts 216 is affixed (Step 102) to a surface, for example a pad or paddle portion 226, of the lead frame 202 by an adhesive 228. It should be understood that the pad portion 226 can be any portion of the lead frame 202 provided to receive a die, for example the pressure sensor element 208. Typically, the pad portion 226 is deformed, for example bent, in such a way that after attachment of the die thereto, the pressure sensor element 208 does not protrude beyond the lead frame 202. In this example, the pad portion 226 is integrally formed with one of the pins 222 having a metallic bridge 230 extending from the pad portion 226 to the pin 222. This allows one of the one or more first electrical contacts 216 to be electrically connected to the pad portion 226 and hence to one of the pins 222. In this regard, the one or more first electrical contacts 216 comprises a first bond pad 232, a second bond pad 234, a third bond pad 236 and a fourth bond pad 238. The bond pads 232, 234, 236, 238 are electrically coupled to respective internal contacts of the lead frame 202 by wire bonding (Step 104). In this regard, the first bond pad 232 is electrically coupled to the pad portion 226 by a first bond wire 240. The second bond pad 234 is electrically coupled to another of the pins 222 by a second bond wire 242 and the third bond pad 236 is electrically coupled to one of the pins 224 by a third bond wire 244. The fourth bond pad 238 is electrically coupled to another of the pins 224 by a fourth bond wire 246. Although, in this example, the bond pads 232, 234, 236, 238 of the pressure sensor element 208 are coupled exclusively to the lead frame 202, in other examples, one or more electrical components and/or devices for example another die (not shown) comprising the one or more electrical components and/or devices, such as a circuit, can be disposed within the second volume 206 and affixed to another surface within the second volume 206. The circuit is, in such an example, an Integrated Circuit (IC), such as a driver or signal conditioning IC. The driver IC can comprise one or more second electrical contacts, for example bond pads. The bond pads 232, 234, 236, 238 can be electrically coupled to the one or more second electrical contacts and/or the leads of the lead frame 202. However, it should be appreciated that the circuit can comprises one or more passive devices, for example one or more capacitors.

Figure 4:
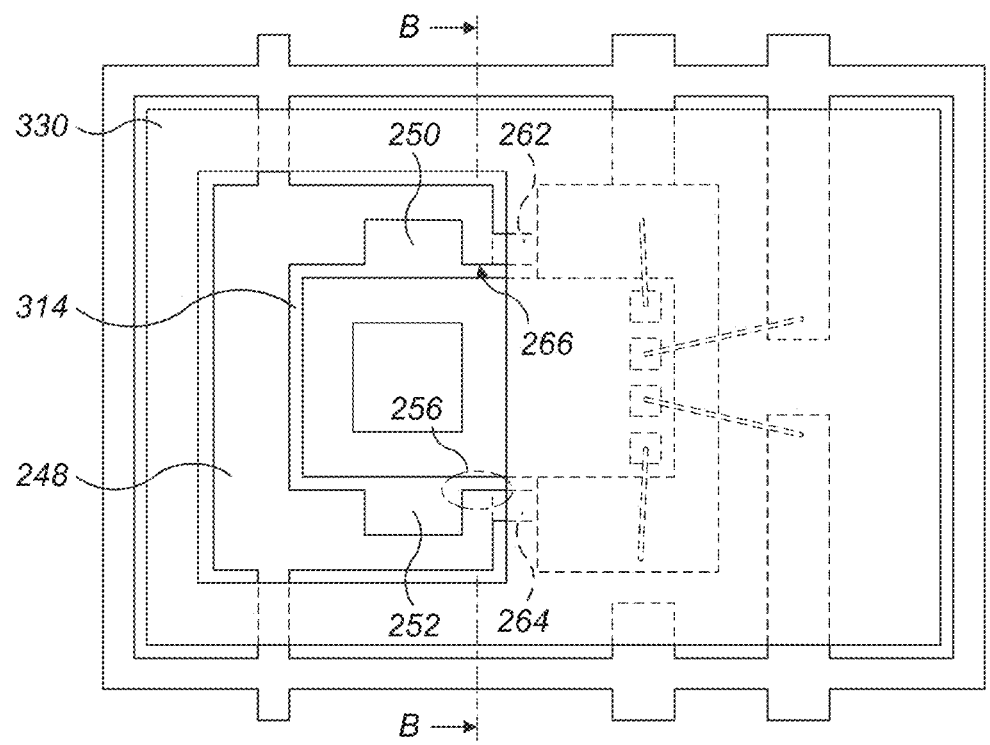
FIG. 4 is a schematic plan view of another lead frame carrying an elongate sensor element constituting another embodiment of the invention.

The lead frame 202 also comprises a cavity reservation portion 248 arranged to define a volume around the first end 210 of the pressure sensor element 208 comprising the membrane 214 that, when the cavity reservation portion 248 is removed after moulding, results in a cavity (not shown in FIGS. 3 and 4) within the first volume 204 into which the pressure sensor element 208 extends in a cantilever-suspended manner. In this example, the cavity reservation portion 248 is a substantially U-shaped rectangular structure that is peripherally spaced between about 10 µm and about 150 µm from the pressure sensor element 208 when the pressure sensor element 208 is in situ in the lead frame 202. In this example, the cavity reservation portion 248 extends around three of the four lateral sides of the pressure sensor element 208 that are to be exposed to ambient when in use to prevent, when moulding, a portion of the first volume 204 from being filled with a moulding compound. In this respect, the cavity reservation portion 248 serves as a spaced peripheral wall extending around a majority of the lateral sides of the portion of the pressure sensor element 208 residing in the first volume 204. The cavity reservation portion 248 comprises a first recess 250 and a second recess 252. The first and second recesses 250, 252 are disposed at an open end 254 of the cavity reservation portion 248 opposite the pad portion 226. The first and second recesses 250, 252 are disposed sufficiently close to the open end 254 of the cavity reservation portion 248 to enable, when moulding, capture of excess moulding compound, thereby preventing the moulding compound from leaking excessively into the first cavity being defined by the cavity reservation portion 248 and the pressure sensor element 208. At the open end 254 of the cavity reservation portion 248 at an interface between the first and second volumes 204, 206, lateral clearances 256 provided between lateral sides of the pressure sensor element 208 and the cavity reservation portion 248 are sufficiently small to restrict, when moulding, flow of mould compound into the volume to be used as the cavity in which the pressure sensor element 208 is to reside. In this example, a first internal metallic lead 258 of the lead frame 202 and a second internal metallic lead 260 support and suspend the cavity reservation portion 248 within the first volume 204 of the lead frame 202. Small portions of the first and second internal metallic leads 258, 260 that pass through a moulded outer peripheral wall 330, formed following moulding (described later herein), remain exposed after removal of the cavity reservation portion 248, for example following stamping out. Depending upon the medium in which the pressure sensor device 200 is to be used, a risk exists of the remnants of the first and second internal metallic leads 258, 260 corroding, which can lead to a through-hole forming in the moulded outer peripheral wall 330. As such, the above-described manner of supporting the cavity reservation portion 248 can be less suitable for applications of the pressure sensor device 200 other than absolute pressure measurement. However, for some applications, it can be acceptable to etch partially and cap these protruding exposed portions of the remnants of the first and second internal metallic leads 258, 260.

Where such corrosion is a possible concern, the cavity reservation portion 248 can be suspended in another manner (FIG. 4). In this regard, and referring to FIG. 4, the first internal bridging portion 262 and a second internal bridging portion 264 are provided to extend respectively from the pad portion 226 into the first volume 204 so as to meet the lateral ends of the U-shaped cavity reservation portion 248 such that, in this example, lateral portions of a peripheral internal surface 266 of the cavity reservation portion 248 extend to the pad portion 226. In a like manner to that described in the previous example of FIG. 3, the cavity reservation portion 248 comprises the first recess 250 and the second recess 252 for, when moulding, capture of excess moulding compound. The cavity reservation portion 248 also provides the lateral clearances 256. However, whilst the structure of this example does not necessarily lead to the formation of through-holes in the moulded peripheral wall 330 of the previous example, remnants of the first and second bridging portions 262, 264 left exposed following moulding and stamping out of the cavity reservation portion 248 can be susceptible to corrosion, which can lead to corrosion of the pad portion 226 in some environments. Consequently, a choice between the structure of FIG. 3 or FIG. 4 can be a design decision driven by the intended application of the pressure sensor device 200.

Referring back to FIG. 1, once the pressure sensor element 208 has been affixed (Step 102) to the pad portion 226 and the wire bonding (Step 104) has been completed, the lead frame 202 carrying the pressure sensor element 208 wire bonded to the lead frame 202 is inserted (Step 106) into a mould 300 compatible with any suitable film-assisted moulding technique.

Figure 5:
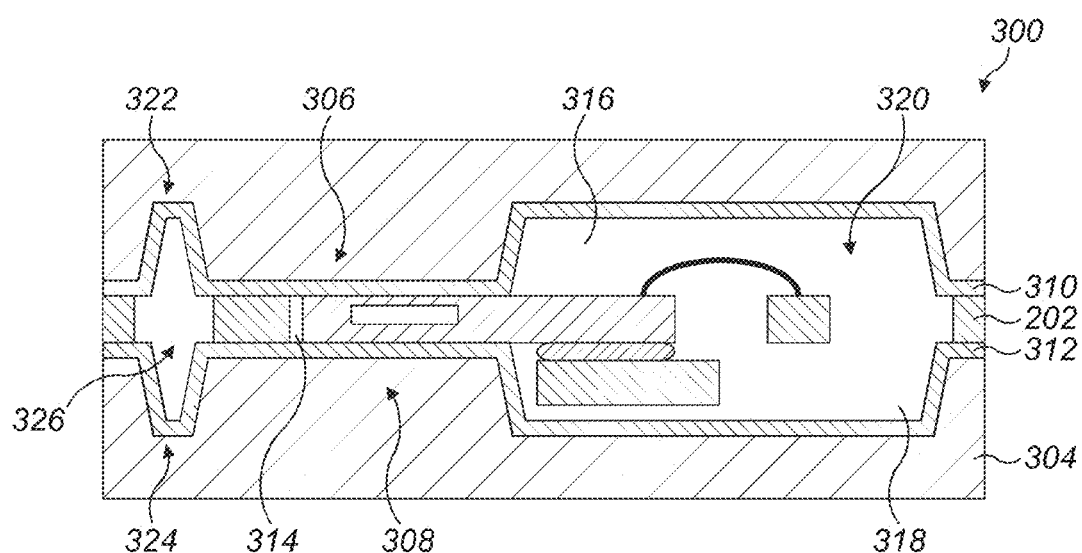
FIG. 5 is a schematic cross section of the lead frame carrying the elongate sensor element of FIG. 3 along the line A-A when inside a packaging mould, although it applies equally to FIG. 4.

Referring to FIG. 5, the mould 300 is opened to receive the wire bonded pressure sensor element 208 affixed to the lead frame 202 therein. The mould 300 comprises an upper mould chase 302 and a lower mould chase 304, each being respectively profiled so as to define, when closed, a package shape in which to encapsulate the lead frame 202 or a part thereof. In this example, the upper mould chase 302 comprises an upper form or insert 306 and the lower mould chase 304 comprises a lower form or insert 308, the upper form 306 tapering inwardly as the upper form 306 extends towards a central longitudinal axis (not shown) with respect to the mould 300 being closed and the lower form 306 tapering inwardly as the lower form 308 extends towards the central longitudinal axis with respect to the mould 300 being closed. In this example, the upper and lower forms 306, 308 are substantially in registry and correspond to a location with respect to the lead frame 202 where the cavity, mentioned above, is to be formed. An upper film 310 abuts the upper mould chase 302 and parts of the lead frame 202 when the mould 300 is closed consistent with the film-assisted moulding technique employed. Similarly, a lower film 312 abuts the lower mould chase 304 and parts of the lead frame 202 when the mould 300 is closed consistent with the film-assisted moulding technique employed. In this example, the upper and lower films 310, 312 are formed from a compressible material, for example Teflon®. The films 310, 312 prevent mould compound flowing over the pressure sensor element 208 or over the moulding support structure, for example the lead frame 202, when the sensor and moulding support structure have different thicknesses.

Figure 6:
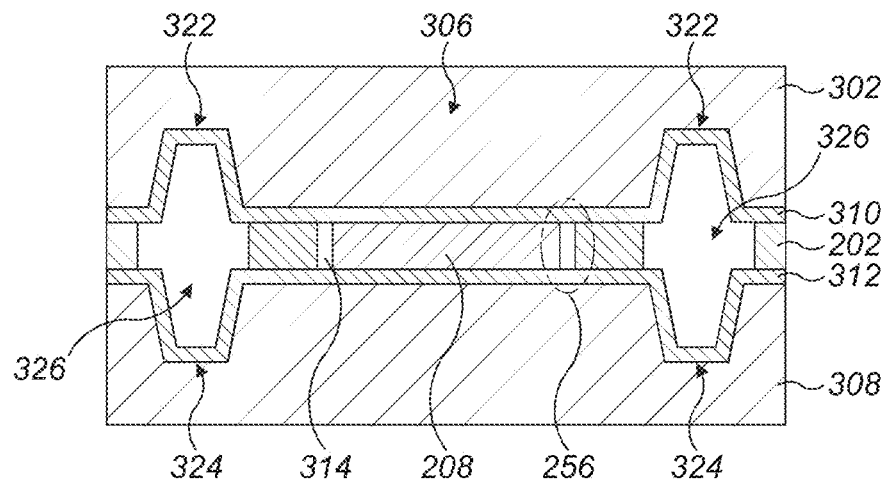
FIG. 6 is a schematic cross section of the lead frame carrying the elongate sensor element of FIG. 4 along the line B-B when inside the packaging mould, although it applies equally to FIG. 3.

Once in the mould 300, the mould 300 is closed around the lead frame 202. The upper form 306 urges a portion of the upper film 310 against an upper surface of the cavity reservation portion 248 and the pressure sensor element 208 and the lower form 308 urges a portion of the lower film 312 against a lower surface of at least part of the cavity reservation portion 248 and the pressure sensor element 208. It can thus be seen that the mould 300 and the lead frame 202 are configured to cooperate to provide predetermined pathways to accommodate the moulding compound. Referring to FIG. 6, the upper form 306 is shaped so as to overlie a peripheral spacing 314 between the pressure sensor element 208 and the cavity reservation portion 248, which corresponds to the lateral clearances 256. The upper mould chase 302 comprises an upper recessed portion 316 (FIG. 5) and the lower mould chase 304 comprises a lower recessed portion 318, which when the mould 300 is closed defines an encapsulation cavity 320 in which to dispose a moulding compound for encapsulating around the second end 212 of the pressure sensor element 208 comprising the bond pads 232, 234, 236, 238 and wire bonding and any other elements disposed within the second volume 206, for example the another die mentioned above. The upper mould chase 302 and the lower mould chase 304 also respectively comprise upper and lower peripheral channel defining portions 322, 324, which cooperate when the mould 300 is closed (Step 108) to provide a peripheral channel portion 326.

Figure 7:
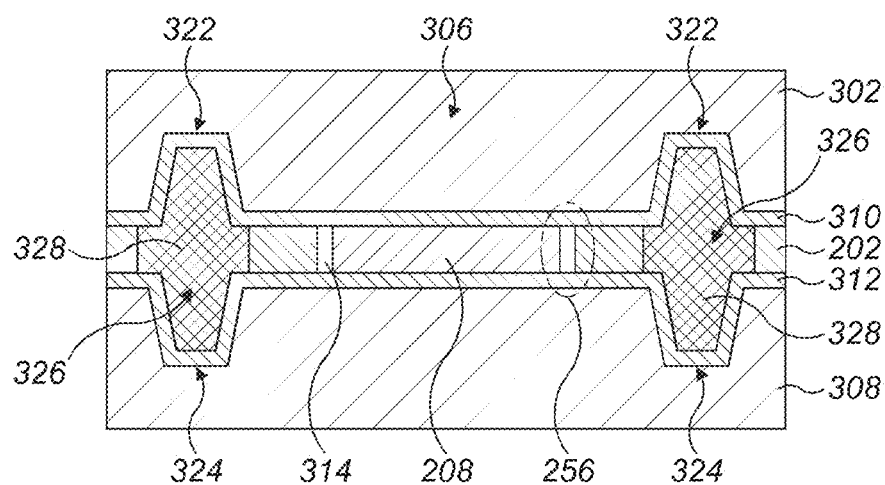
FIG. 7 is the schematic cross section of FIG. 6 comprising moulding compound.
Figure 8:
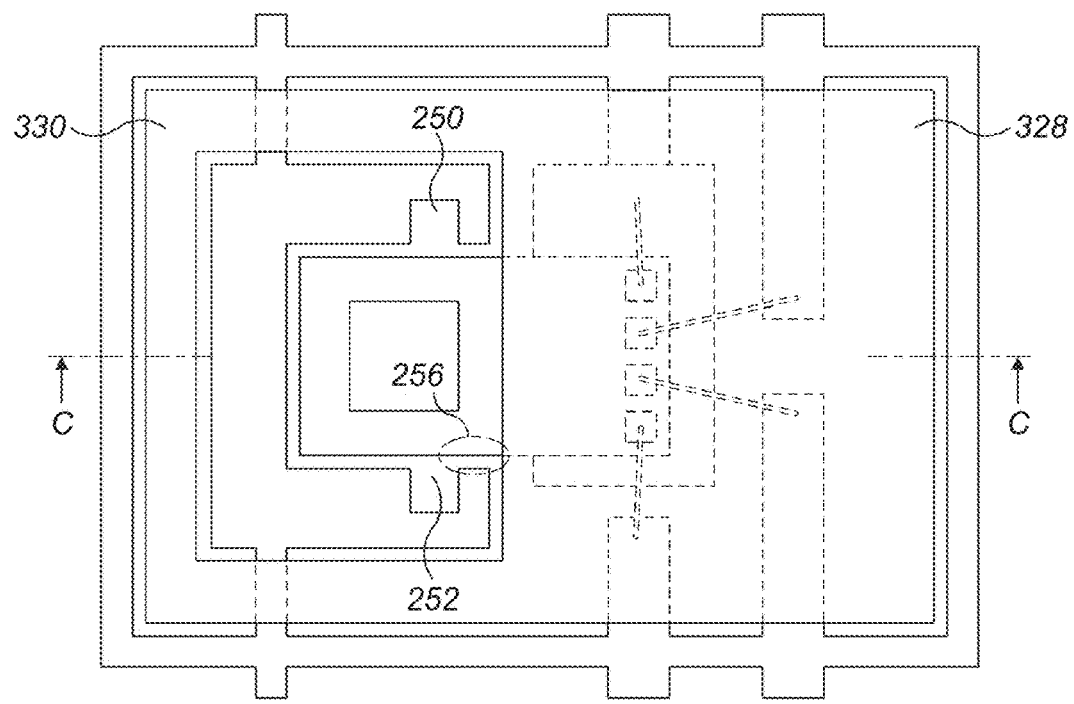
FIG. 8 is a schematic plan view of the sensor device comprising the lead frame of FIGS. 2 and 3 following completion of moulding in the packaging mould of FIG. 5.
Figure 9:
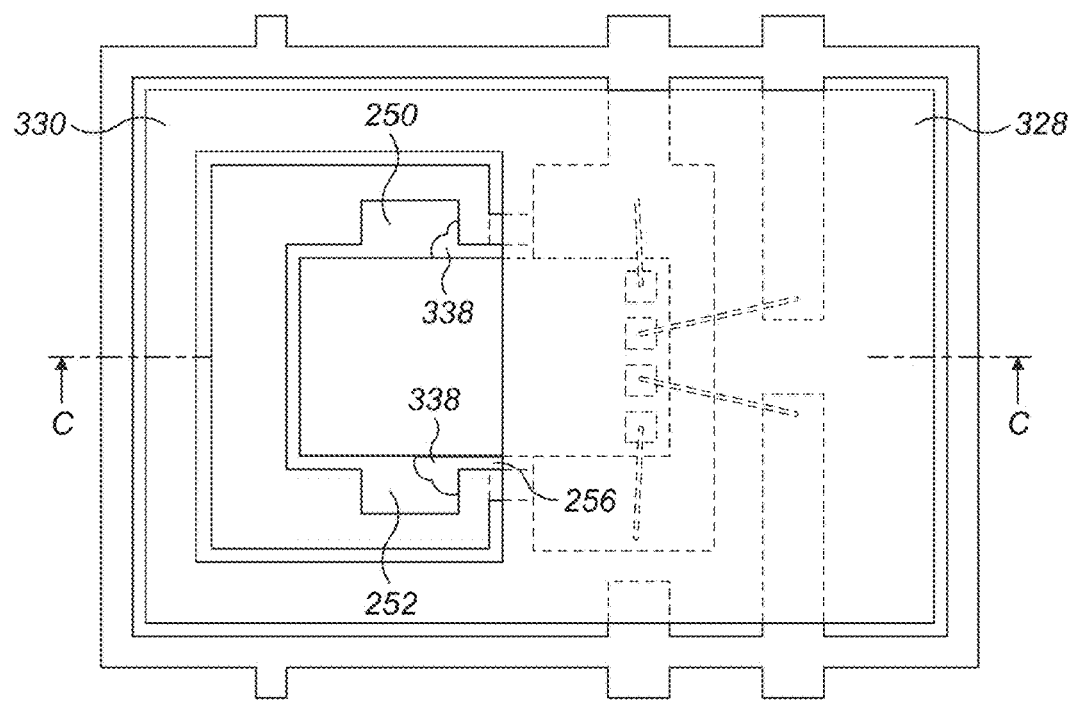
FIG. 9 is a schematic plan view of the sensor device comprising the lead frame of FIG. 4 following completion of moulding in the packaging mould of FIG. 5.

After the mould 300 is closed (Step 108), a moulding compound 328 is injected (Step 110) into the mould 300 and the moulding compound 328 fills the predetermined pathways mentioned above. After a predetermined period of time injecting the moulding compound 328 (Step 112), the mould 300 is opened and the completed moulding is removed (Step 114). Referring to FIGS. 7, 8 and 9, the moulding compound 328 is injected for the predetermined period of time to ensure that only a specific volume of the moulding compound 328 is injected into the mould 300 so that no more than a nominal amount of the moulding compound 328 enters the peripheral spacing 314 via the lateral clearances 256. The lateral clearances 256 provide flow resistance to the moulding compound 328 and the size of the lateral clearances 256 contribute to the control of the amount of the moulding compound 328 entering the peripheral spacing 314. Furthermore, any of the moulding compound 328 that leaks 338 into the peripheral spacing 314 is captured in the first and second recesses 250, 252 (FIG. 9), which is the purpose for which the first and second recesses 250, 252 are provided, thereby avoiding ingress of the moulding compound 328 into the peripheral spacing 314 and hence an accumulation of the moulding compound 328 in the remaining space of the peripheral spacing 314 beyond the first and second recesses 250, 252. The edges of the pressure sensor element 208 are therefore kept free of mould compound 328 during moulding. The respective sizes of the first and second recesses 250, 252 are sufficiently large to ensure all expected moulding compound 328 entering the peripheral spacing 314 via the lateral clearances 256 is captured.

Figure 10:
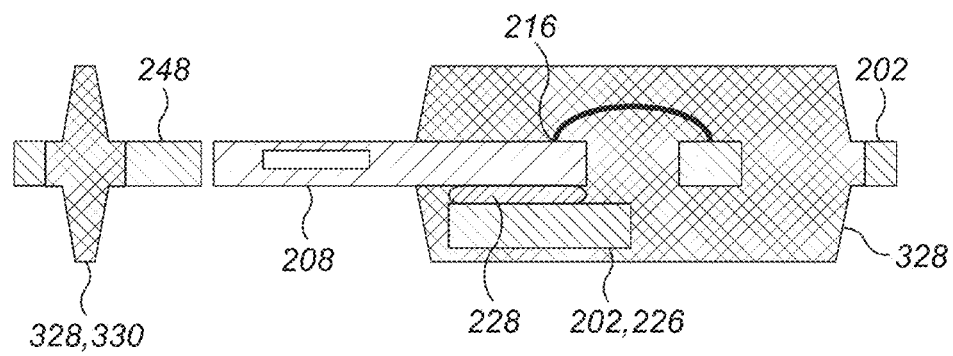
FIG. 10 is a schematic cross section of the sensor device of FIG. 8 along the line C-C, although it applies equally to the sensor device of FIG. 9.

Referring to FIG. 10, when the moulding is completed, the end of the pressure sensor element 208 comprising the bond pads 232, 234, 236, 238, the wire bonds 240, 243, 244, 246 and the portions of the metallic leads in the second volume 206 are encapsulated in set moulding compound and the encapsulation extends to form the moulded outer peripheral wall 330 defining the cavity as defined by the peripheral channel portion 326 of the mould 300. However, the application of the upper and lower forms 306, 308, against the respective surfaces of the pressure sensor element 208 and the cavity reservation portion 248, prevents the moulding compound 328 from entering the peripheral spacing 314 between the pressure sensor element 208 and the cavity reservation portion 248.

Figure 11:
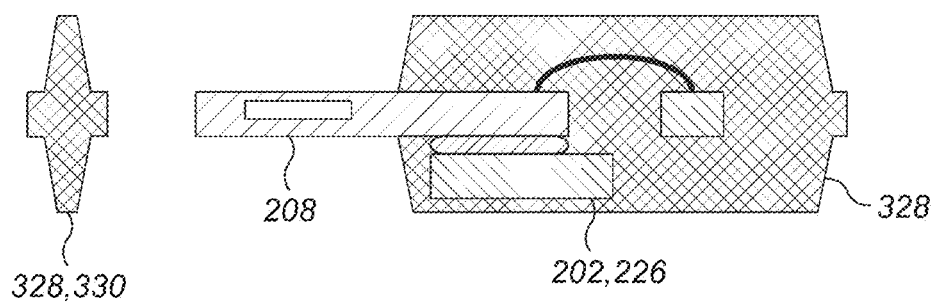
FIG. 11 is the schematic cross section of FIG. 10 following removal of unwanted exposed portions of the lead frame.

The unwanted parts of the lead frame package 202 are then removed (Step 116). Typically, these are the parts of the lead frame package 202 that are not encapsulated in the moulding compound 328 and not required for electrical connections. The unwanted parts of the lead frame package 202, particularly but not exclusively the cavity reservation portion 248, are stamped out (FIG. 11) to leave the pressure sensor element 208 extending into the cavity in a cantilever-suspended manner, and having a clearance around the exposed end of the pressure sensor element 208 to allow the pressure sensor element 208 to be exposed to ambient when in use.

Figure 12:
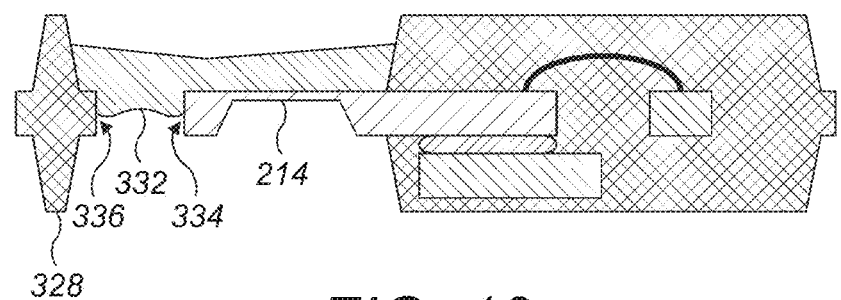
FIG. 12 is the schematic cross section of FIG. 11, when the elongate sensor element is being used to form a relative pressure sensor device, and a gel layer is applied.

The skilled person should appreciate that the above-described implementations are merely examples of the various implementations that are conceivable within the scope of the appended claims. Indeed, it should be appreciated that a relative pressure sensor device (FIG. 12) can, for example, be formed by etching an opposite side to the membrane 214 of the pressure sensor element 208 to expose the membrane 214 from a hitherto unexposed side and a gel 332 can be applied (FIG. 1: step 118) over the membrane 214 so as to bridge a spacing between an exposed end surface 334 of the pressure sensor element 208 and an inner surface 336 of a portion of the peripheral cavity wall 328 opposite the exposed end surface 334.

What is claimed is:

1. A method of manufacturing a sensor device, the method comprising:
    configuring a lead frame and a packaging mould so as to provide predetermined pathways to accommodate a moulding compound, the lead frame delineating a first notional volume therein adjacent a second notional volume therein;
    configuring an elongate sensor element and the lead frame so that the lead frame fixedly carries the elongate sensor element and the elongate sensor element bridges the first notional volume of the lead frame and extends towards the second notional volume of the lead frame, the elongate sensor element having an electrical contact electrically coupled to another electrical contact disposed within the second notional volume;
    disposing the lead frame carrying the elongate sensor element within the packaging mould;
    configuring the lead frame and the packaging mould so as to cooperate to provide predetermined pathways to accommodate a moulding compound; and
    introducing the moulding compound into the packaging mould during a predetermined period of time so that the moulding compound fills the predetermined pathways, the moulding compound filling the second notional volume and surrounding the elongate sensor element within the first notional volume without substantially contacting the elongate sensor element.

2. The method according to claim 1, wherein the sensor device is moulded using a film-assisted moulding technique.

3. The method according to claim 1, further comprising:
    configuring the packaging mould to prevent a portion of the first notional volume from being filled with the moulding compound.

4. The method according to claim 1, further comprising:
    configuring the lead frame and the elongate sensor element to cooperate to define a restrictive channel at a side of the elongate sensor element extending from an interface between the first notional volume and the second notional volume.

5. The method according to claim 1, further comprising:
    configuring the lead frame and the elongate sensor element to cooperate to define respective restrictive channels at lateral sides of the elongate sensor element extending from an interface between the first notional volume and the second notional volume.

6. The method according to claim 4, further comprising:
    configuring the lead frame to provide a recess for capturing ingress of excess moulding compound into the first notional volume.

7. The method according to claim 5, further comprising:
    configuring the lead frame to provide respective recesses either lateral side of the elongate sensor element for capturing ingress of excess moulding compound into the first notional volume.

8. The method according to claim 4, further comprising:
    configuring the lead frame to provide a spaced peripheral wall extending around a portion of the elongate sensor element to be exposed following packaging;
    configuring the spaced peripheral wall to surround substantially the lateral sides of the portion of the elongate sensor element in peripheral spaced relation, thereby defining a peripheral space around the lateral sides of the portion of the elongate sensor element residing in the first notional volume; and wherein
    the spaced peripheral side wall defines the restrictive channel.

9. The method according to claim 8, wherein the packaging mould comprises a mould chase, the mould chase being configured to overlie at least in part the spaced peripheral wall, thereby limiting ingress of moulding compound into the peripheral space.

10. The method according to claim 8, further comprising:
    stamping out the spaced peripheral wall of the lead frame following completion of moulding of the sensor device.

11. The method according to claim 1, further comprising:
    configuring the lead frame to provide another surface to receive at least one of one or more electrical components or one or more devices.

12. The method according to claim 11, further comprising:
    affixing the at least one of the one or more electrical components or the one or more devices to the another surface.

13. The method according to claim 12, wherein the affixing the at least one of the one or more electrical components the one or more devices to the another surface comprises:
    affixing an integrated circuit to the another surface.

14. The method according to claim 1, further comprising:
    disposing the lead frame carrying the elongate sensor element within the packaging mould with the elongate sensor element bridging the first and second notional volumes, thereby extending into the second notional volume so as to reside partially in the second notional volume.

15. The method according to claim 1, wherein after moulding, the elongate sensor element has an exposed end surface distal from an end of the elongate sensor element encapsulated in the moulding compound, and the sensor device has a peripheral moulded outer wall formed from the moulding compound having an inner surface opposite the exposed end surface; the method further comprising:

depositing a soft encapsulant over an exposed portion of the elongate sensor element, the soft encapsulant being deposited so as to bridge a spacing between the exposed end surface and the inner surface of a portion of the peripheral wall opposite the exposed end surface.

* * * * *